(12) United States Patent
Zimmer

(10) Patent No.: US 7,678,585 B2
(45) Date of Patent: Mar. 16, 2010

(54) MAGNETORESISTIVE SENSOR MODULE AND METHOD OF MANUFACTURING THE SAME

(75) Inventor: Juergen Zimmer, Ottobrunn (DE)

(73) Assignee: Infineon Technologies AG, Munich (DE)

(*) Notice: Subject to any disclaimer, the term of this patent is extended or adjusted under 35 U.S.C. 154(b) by 569 days.

(21) Appl. No.: 11/538,663

(22) Filed: Oct. 4, 2006

(65) Prior Publication Data

US 2007/0264422 A1 Nov. 15, 2007

(30) Foreign Application Priority Data

Oct. 4, 2005 (DE) .................... 10 2005 047 482

(51) Int. Cl.
*H01L 21/00* (2006.01)
(52) U.S. Cl. .................. 438/3; 438/795; 257/E21.663; 257/E21.665
(58) Field of Classification Search .................. 438/3, 438/795, 799; 257/295, 421, E27.006, E21.665, 257/E21.663
See application file for complete search history.

(56) References Cited

U.S. PATENT DOCUMENTS

| | | | |
|---|---|---|---|
| 6,426,620 B1 | 7/2002 | Taguchi et al. | 324/207.21 |
| 6,501,678 B1 | 12/2002 | Lenssen et al. | 365/173 |
| 6,842,367 B2* | 1/2005 | Hidaka | 365/173 |
| 2004/0087037 A1 | 5/2004 | Berg et al. | 438/3 |
| 2005/0020011 A1* | 1/2005 | Nakajima et al. | 438/257 |
| 2006/0023561 A1* | 2/2006 | Motoyoshi | 365/232 |

FOREIGN PATENT DOCUMENTS

| DE | 19922136 | 12/1999 |
|---|---|---|
| DE | 10117355 | 10/2002 |

* cited by examiner

*Primary Examiner*—Khiem D Nguyen
(74) *Attorney, Agent, or Firm*—Eschweiler & Associates, LLC

(57) ABSTRACT

A composite arrangement has a substrate material with a main surface, a metal-insulator arrangement including a metal sheet with an insulation area on the main surface, and a magnetoresistive structure on the metal-insulator arrangement. Thereupon, a cover layer arrangement is heated, so that the same at least partially covers the magnetoresistive structure with a target thickness D, and finally the magnetoresistive structure is heated by light radiation with given wavelength λ. The absorbed portion of the emitted radiation depends on the actual thickness D' of the cover layer arrangement and the wavelength λ, wherein the target thickness D of the cover layer arrangement is adjusted so that, if the cover layer deviates from the target thickness D in a range of ±20% with reference to the target thickness D, a change of the absorbed portion of the emitted radiation in the magnetoresistive structure of less than ±40% is caused.

21 Claims, 9 Drawing Sheets

Functional Block Diagram

MAGNETORESISTIVE SENSOR MODULE AND METHOD OF MANUFACTURING THE SAME

PRIORITY

This application claims priority from German Patent Application No. 102005047482.9, which was filed on Oct. 4, 2005, and is incorporated herein by reference in its entirety.

TECHNICAL FIELD

The present invention relates to magnetoresistive sensor modules and, in particular, to a procedure for manufacturing magnetoresistive sensor modules, preferably with a multiplicity of individual magnetoresistive sensor elements for the detection and evaluation of external magnetic fields.

BACKGROUND

Sensors converting magnetic or magnetically coded information to an electric signal play an ever-greater role in today's technology. They find application in all fields of technology in which the magnetic field may serve as an information carrier, i.e. in vehicle technology, mechanical engineering/robotics, medical technology, non-destructive materials testing, and in micro-system technology. With the aid of such sensors, a multiplicity of different mechanical parameters are sensed, such as position, velocity, angular position, rotational speed, acceleration, etc., but current flow, wear, or corrosion may also be measured.

For the sensing and evaluation of magnetic or magnetically coded information, magnetoresistive devices or sensor elements are increasingly employed in technology. Magnetoresistive devices, which may be arranged as single elements or also in form of a plurality of connected single elements, increasingly find application today in numerous applications for contactless position and/or movement detection of a giver object with reference to a sensor arrangement, particularly in automobile technology, such as for ABS systems, traction control systems, etc. For this purpose, rotation angle sensors on the basis of magnetoresistive elements or structures, which will generally be referred to as xMR structures in the following, are frequently used. In the following description, the term "xMR structure" shall include all known magnetoresistive structures, such as AMR (anisotropic magnetoresistance) structures, GMR (giant magnetoresistance) structures, CMR (colossal magnetoresistance) structures, TMR (tunnel magnetoresistance) structures, or EMR (extraordinary magnetoresistance) structures. In technical applications of GMR sensor arrangements, so-called spin valve structures are preferably used today, as illustrated in FIGS. 5a-c, for example.

In the following, it will now at first be briefly gone into GMR structures in general. GMR structures are almost always operated in a so-called CIP (current-in-plane) configuration, i.e. the applied current flows in parallel to the sheet structure. In the GMR structures, there are some basic types that have gained acceptance in practice. In practice, e.g. when employed in automobile technology, above all large temperature windows, for example from −40° C. to +150° C., and small field strengths of few kA/m are necessary for optimum and safe operation. The most important GMR structures for the practical employment are illustrated in FIGS. 5a-c.

The GMR structure illustrated in FIG. 5a shows the case of a coupled GMR system 500, in which magnetic layers 502, 506, e.g. of cobalt (Co), are separated by a non-magnetic layer 504, e.g. of copper (Cu). The thickness of the non-magnetic layer 504 is chosen so that antiferromagnetic coupling of the soft-magnetic layers 502, 506 develops without a magnetic field applied. This is meant to be illustrated by the depicted arrows. An external field then forces the parallel orientation of the magnetization of the soft-magnetic layers 502, 506, whereby the resistance of the GMR structure decreases.

The GMR structure illustrated in FIG. 5b shows a spin valve system 501, in which the non-magnetic layer 504 is chosen so thick that no more coupling of the soft-magnetic layers 502, 506 develops. The lower magnetic layer 506 is strongly coupled to an antiferromagnetic layer 508, so that it is magnetically hard (comparable with a permanent magnet). The upper magnetic layer 502 is soft magnetic and serves as measuring layer. It may be remagnetized by already a small external magnetic field M, whereby the resistance R changes.

In the following, it is now gone into the spin valve arrangement 501 illustrated in FIG. 5b in greater detail. Such a spin valve structure 501 consists of a soft-magnetic layer 502, which is separated, by a non-magnetic layer 504, from a second soft-magnetic layer 506, the magnetization direction of which is, however, pinned by the coupling with an antiferromagnetic layer 508 by means of the so-called "exchange bias interaction". The principle functioning of a spin valve structure may be illustrated by means of the magnetization and R(H) curve in FIG. 5b. The magnetization direction of the magnetic layer 506 is pinned in negative direction. If the external magnetic field M is increased from negative to positive values, the "free", soft-magnetic layer 502 switches near the zero crossing (H=0), and the resistance R rises sharply. The resistance R then remains high until the external magnetic field M is great enough to overcome the exchange coupling between the soft-magnetic layer 506 and the antiferromagnetic layer 508 and to switch also the magnetic layer 506.

The GMR structure 501 illustrated in FIG. 5c differs from the GMR structure illustrated in FIG. 5b in that here the lower antiferromagnetic layer 508 is replaced by a combination of a natural antiferromagnet 510 and an synthetic antiferromagnet 506, 507, 509 (SAF) on top, which is composed of the magnetic layer 506, a ferromagnetic layer 507, and a non-magnetic layer 509 therebetween. In this manner, the magnetization direction of the magnetic layer 506 is pinned. The upper, soft magnetic layer 502 again serves as measuring layer, the magnetization direction of which can be rotated easily by an external magnetic field M. The advantage of the use of the combination of natural and synthetic antiferromagnets as compared to the construction according to FIG. 5b here is the greater field and temperature stability.

In the following, it is now gone into so-called TMR structures in general. For TMR structures, the application spectrum is very similar to that of GMR structures. FIG. 6 shows a typical TMR structure. The tunnel magnetoresistance TMR is obtained in tunnel contacts, in which two ferromagnetic electrodes 602, 606 are decoupled by a thin, insulating tunnel barrier 604. Electrons can tunnel through this thin barrier 604 between the two electrodes 602, 606. The tunnel magnetoresistance is based on the tunnel current being dependent on the relative orientation of the magnetization direction in the ferromagnetic electrodes.

The magnetoresistive structures (GMR/TMR) previously described thus have an electrical characteristic dependent on an applied magnetic field, i.e. the resistivity of an xMR structure of a magnetoresistive device is influenced by an influencing external magnetic field.

In bridge arrangement, rotation angle sensors on the basis of the GMR effect may provide an inherent 360° uniqueness of the magnetic field to be detected and have relatively high sensitivity with reference to the magnetic field to be detected.

In order to realize 360° detection by means of a magnetoresistive structure and particularly an GMR/TMR spin valve structure of a plurality of magnetoresistive devices, to detect the rotation direction of a wheel or a shaft with reference to the sensor arrangement, for example, eight magnetoresistive devices are connected with two Wheatstone bridge arrangements (connected in parallel), wherein one of the bridge circuits has reference magnetizations aligned perpendicularly to those of the other bridge circuit. Within each bridge circuit of four magnetoresistive devices, the reference magnetizations are arranged in antiparallel manner, so that both bridge circuits provide sinusoidal signals dependent on the rotation angle of an external magnetic field, which are 90° phase shifted with respect to each other. Via an arctan computation of both output signals, i.e. the output signal of the first and second bridge circuits, the angle over a 360° range can be uniquely determined.

The reference magnetizations of the individual elements of the GMR/TMR spin valve structure may have up to four locally different directions. For adjusting the reference direction, the spin valve layer system has to be heated above the so-called "blocking temperature" (depending on magnetoresistive material system employed) up to 400° C. and cooled again in a lateral magnetic field of the desired direction. This procedure is also referred to as conditioning the magnetoresistive structure. For manufacturing a magnetoresistive sensor structure, locally heating the respective individual elements is therefore required, without also heating neighboring magnetoresistive elements above the blocking temperature during the magnetization procedure. Here, one possibility is locally illuminating with a laser with sufficient radiation energy per unit area, for example.

In FIG. 7, a principle circuit diagram of a possible connection in form of a double bridge circuit 700 with eight magnetoresistive magnetic field sensor elements is illustrated. The double bridge arrangement 700 includes a first bridge circuit arrangement 702 and a second bridge circuit arrangement 704, each out of four magnetoresistive individual elements 702a-b, 704a-b, the magnetizations of which are indicated with reference to the x-axis and y-axis illustrated in FIG. 7. The first bridge circuit 702 includes two magnetoresistive devices 702a with permanent magnetization antiparallel to the x-axis indicated and two magnetoresistive devices 702b with permanent magnetization parallel to the x-axis. The double bridge circuit arrangement 700 further includes a second bridge circuit 704, which comprises two magnetoresistive devices 704a with permanent magnetization in the y direction and two magnetoresistive devices 704b with permanent magnetization antiparallel to the y direction each. The individual magnetoresistive devices 702a, 702b, 704a, 704b are connected, as indicted in FIG. 7, wherein the first and second bridge circuits 702 and 704 are connected to each other in parallel and further connected between a supply voltage and a ground potential.

During the operation of the magnetoresistive sensor arrangement 700 of FIG. 7, the first bridge circuit 702 provides an output signal $V_X$ between the two center taps of the first bridge circuit, wherein the second bridge circuit 704 provides an output signal $V_Y$ between the two center taps of the second magnetoresistive bridge circuit. The connection of the magnetoresistive devices 702a,b and 704a,b described with reference to FIG. 7 allows for the detection of an external, rotating magnetic field over an angle range of 360°. The sinusoidal output signals $V_X$ and $V_Y$ of the two bridge circuits connected in parallel are obtained as a function of the rotating, external magnetic field, wherein the two output signals $V_X$ and $V_Y$ are phase shifted with reference to each other by an angle of 90° each.

GMR sensor elements are constructed such that meander-shaped GMR structures form the resistance elements, which are preferably connected in a bridge circuit. Meander-shaped structures are used to provide sufficiently long, magnetoresistive resistance elements, so that sufficiently high changes in resistance can be determined.

Manufacturing processes known in the prior art for GMR/TMR sensor elements include only the construction of a GMR/TMR sensor device and its contacting. Up to now, only GMR or TMR sensor structures in form of discrete devices are known. GMR/TMR sensor devices previously known in the prior art substantially are magnetoresistive resistance structures accommodated in normal SMD (surface mounted device) packages, wherein a GMR sensor device and its pin occupancy (terminal occupancy) are shown in FIG. 8a, for example. In FIG. 8b, the accompanying functional block diagram is illustrated in principle. The sensor device illustrated in FIG. 8a is to be coupled externally with an evaluating circuit (not shown in FIGS. 8a-b).

An electronic circuit externally associated with the GMR sensor device 800 is required to calibrate the sensor output signal (out+, out−), in order to obtain high absolute accuracy of a GMR sensor arrangement on the one hand. An electronic circuit is also required to condition the sensor output signal and also to provide the sensor output signal in a correspondingly processed, digital or analog interface for further evaluation. Such an additional electronic circuit has to be made available in form of a second device on a circuit board, for example.

According to the prior art, it is indeed also possible to accommodate the electronic circuit for evaluating or rendering the GMR sensor output signal on an additional semiconductor chip to the GMR sensor element within a device package, wherein the GMR sensor element and the semiconductor chip are connected to each other by means of bond wires, for example. But this procedure is problematic in that the necessary chip areas and the connection of both chips, i.e. of the GMR sensor element and the electronic evaluation and rendering circuit, generate corresponding, additional chip costs and assembly costs due to the greater package effort owing to the additional bondings between the GMR sensor element and the semiconductor chip. This additional package effort may also lead to increased parasitic influences, which may affect the sensor properties. Moreover, it should be noted that the final sensor application is limited to the package shapes customary in the market for reception and connection of two chips, i.e. the GMR sensor element and the electronic evaluating and rendering circuit.

SUMMARY

According to one embodiment, a method of manufacturing a magnetoresistive device may comprise the steps of: providing a composite arrangement with a substrate material with a main surface, a metal-insulator arrangement on the main surface of the substrate material, the metal-insulator arrangement including a metal sheet with an insulation area at least partially surrounding the same, and a magnetoresistive structure on the metal-insulator arrangement; applying a cover layer arrangement on the magnetoresistive structure, so that the same at least partially covers the magnetoresistive structure with a target thickness D, and heating the magnetoresistive structure by exposing the same to radiation emitted from a light source with given wavelength λ, wherein the magnetoresistive structure absorbs a portion of the emitted radiation; wherein the absorbed portion of the emitted radiation depends on an actual thickness D' of the cover layer arrangement and the wavelength λ of the emitted radiation; wherein the target thickness D of the cover layer arrangement is adjusted so that, if in the step of applying the cover layer arrangement a deviation of the actual thickness D' from the target thickness D in a range of ±20% with reference to the target thickness D occurs for process reasons, a change of the absorbed portion of the emitted radiation in the magnetoresistive structure of less than ±40% is caused.

BRIEF DESCRIPTION OF THE DRAWINGS

These and other objects and features of the present invention will become clear from the following description taken in conjunction with the accompanying drawings, in which.

DETAILED DESCRIPTION

Figure 1A:
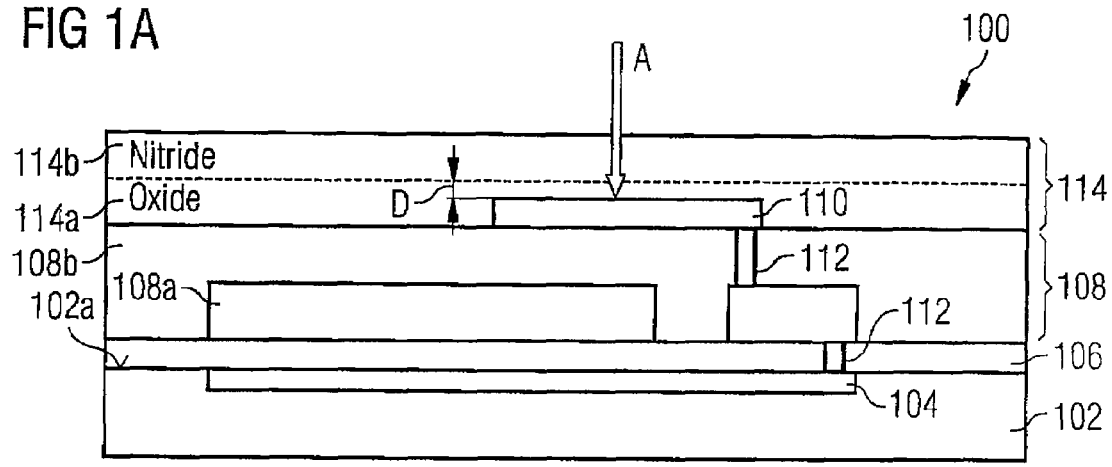
FIGS. 1*a-c* are a schematic cross-sectional illustration of a magnetoresistive sensor module according to the present invention and accompanying illustrations of the relative absorption $\alpha_{rel}$ of radiation of first and second wavelengths (λ=532 nm and 1064 nm, respectively) in a magnetoresistive structure as a function of the thickness of a cover layer arrangement over the magnetoresistive structure.

According to another embodiment, a magnetoresistive device, may have: a composite arrangement with a substrate material with a main surface; a metal-insulator arrangement on the main surface of the substrate material, the metal-insulator arrangement having a metal sheet with an insulation material at least partially surrounding the same; and a magnetoresistive structure on the metal-insulator arrangement; and a cover layer arrangement on the magnetoresistive structure, so that the same at least partially covers the magnetoresistive structure with a target thickness D; wherein the magnetoresistive structure is formed to absorb a portion of the emitted radiation, the absorbed portion of the emitted radiation depending on an actual thickness D' of the cover layer arrangement and the wavelength λ of the emitted radiation; and wherein the target thickness D of the cover layer arrangement is adjusted so that, if in the step of applying the cover layer arrangement a deviation of the actual thickness D' from the target thickness D in a range of ±20% with reference to the target thickness D occurs for process reasons, a change of the absorbed portion of the emitted radiation in the magnetoresistive structure of less than ±40% is caused.

According to yet another embodiment, a wafer arrangement, may have a plurality of magnetoresistive devices, each may have: a composite arrangement with a substrate material with a main surface; a metal-insulator arrangement on the main surface of the substrate material, the metal-insulator arrangement having a metal sheet with an insulation material at least partially surrounding the same; and a magnetoresistive structure on the metal-insulator arrangement; and a cover layer arrangement on the magnetoresistive structure, so that the same at least partially covers the magnetoresistive structure with a target thickness D; wherein the magnetoresistive structure is formed to absorb a portion of the emitted radiation, the absorbed portion of the emitted radiation depending on an actual thickness D' of the cover layer arrangement and the wavelength λ of the emitted radiation; and wherein the target thickness D of the cover layer arrangement is adjusted so that, if in the step of applying the cover layer arrangement a deviation of the actual thickness D' from the target thickness D in a range of ±20% with reference to the target thickness D occurs for process reasons, a change of the absorbed portion of the emitted radiation in the magnetoresistive structure of less than ±40% is caused.

A magnetoresistive sensor device, and for example a GMR/TMR sensor module, may be obtained by extending the manufacturing process for an integrated semiconductor circuit arrangement on a semiconductor substrate, such as a semiconductor wafer, in that, in addition to the integrated semiconductor circuitries, a magnetoresistive layer structure is applied in the semiconductor substrate and a metal-insulator layer stack arranged thereon.

For the protection of the magnetoresistive sensor module, i.e. the magnetoresistive sensor device and the integrated semiconductor circuit arrangement, preferably a passivation layer, for example of an oxide or nitride material, for exerting a protective function on the magnetoresistive structure is now also applied on the metal-insulator layer stack, wherein additionally also an additional passivation layer of a photoimide material may be applied, for example, whereby extremely positive properties with reference to an accommodation of the magnetoresistive sensor module in a package can be obtained.

A stable and fabrication-suited manufacturing with local laser conditioning of integrated, magnetoresistive devices (particularly GMR/TMR sensor modules) within the scope of a common semiconductor manufacturing process, e.g. in a CMOS/BiCMOS-compatible semiconductor manufacturing flow, with high yield can be achieved by the target thickness of a cover layer arrangement (passivation) above the magnetoresistive structure being adjusted so that, even if fabrication-induced variations in the actually obtained thickness of the cover layer arrangement within a known tolerance range occur, the optical absorption behavior of the magnetoresistive structure is subject to only minor variations, i.e. the variations are within a fabrication-induced tolerance range, when exposing the same to a radiation of a light source, i.e. in the conditioning of the magnetoresistive structure preferably within the scope of a laser magnetization process.

The procedure in which the magnetoresistive structure is heated to a temperature above the so-called blocking temperature, which may be up to 400° C. depending on magnetoresistive material system employed, and again cooled in a lateral magnetic field of the desired direction is regarded as conditioning a magnetoresistive structure.

Stable behavior of the optical reflectivity or the optical absorption behavior of the layer system of the magnetoresistive device with reference to layer thickness variations of the cover layer arrangement (passivation layer) has the advantage that the laser power required for an optimal laser magnetization process can be adjusted relatively easily, because the optimum laser power has to be determined only at a few and preferably only at one point on the wafer, for example. The obtained value for the laser power to be adjusted then is substantially representative of the entire wafer.

Thus, it can be avoided that an optical behavior instable with reference to layer thickness variations of the passivation layers necessitates a determination of the required laser energy at a plurality of points on the wafer and an interpolation between these points for the generation of a "power map", whereby very low time and cost outlay in a semiconductor manufacturing process can be realized according an embodiment. With this, increased yield of the obtained magnetoresistive devices can be achieved, which can be extremely advantageous for cost and capacity reasons.

In accordance with an embodiment, the effects of the variations in the layer thicknesses of the passivation materials arranged above the magnetoresistive structures thus are reduced both within a wafer and from wafer to wafer by choosing the optical properties and the launched laser power so that the temperature values of the magnetoresistive structures obtained due to the absorbed radiation only vary insignificantly during conditioning thereof. In particular, this is achieved by adapting the thickness of the oxide passivation material such that the value for the target thickness lies about at the center of an absorption plateau of the laser power launched into the magnetoresistive structure of magnetoresistive layer stack, in order to allow for maximum layer thickness variation of the actual layer thickness at a given maximum change of the absorbed portion of the emitted radiation in the magnetoresistive structure. According to an embodiment, a working point optimized and stable with reference to layer thickness variations of the passivation layer may thus be achieved in a semiconductor manufacturing process for magnetoresistive sensor modules.

According to an embodiment, a stable, reliable, and reproducible method of manufacturing magnetoresistive devices with high, fabrication-suited yield can also be achieved when a further cover layer arrangement, e.g. of a polyimide material, is used, in which it has to be reckoned with relative high variations in thickness of this additional passivation layer for process-technological reasons. To this end, recesses in this further cover layer arrangement are created by means of a structuring step, wherein these recesses can be passed through by the light radiation of the light source in the conditioning of the magnetoresistive device. With this, independently of possible layer thickness variations of the additional passivation layer, the optical absorption behavior of the magnetoresistive structure may be kept substantially stable or constant within a certain tolerance range.

Opening or providing a further cover layer arrangement (e.g. polyimide passivation layer) with recesses further contributes to a further increase in yield and to the reduction of costs in the manufacture of magnetoresistive sensor modules within conventional semiconductor manufacturing processes. In particular, this procedure is to be considered when the variation in thickness of the further cover layer arrangement, for process reasons, is subject to such great variations that adjusting the layer thickness (target layer thickness) to a target value deviates that much from the actually obtained layer thickness values, so that uncontrollable variations of the irradiated power of the radiation source (e.g. laser light power) occur within the scope of the conditioning of the magnetoresistive structure. According to an embodiment, the problem of the variation of the layer thicknesses may thus be solved for additional passivation layers by removing the photosensitive polyimide or photoimide material necessary in many technologies in the areas exposed to the emitted radiation of a radiation source during the laser magnetization process (conditioning process) within the scope of a standard process above the sensor structures.

The technical realization of the manufacturing method thus supports the manufacture of magnetic field sensor modules in vertical, monolithical integration by means of a metal layer stack with one or more metal layers and insulating layers therebetween. The metal layer stack is arranged above the active chip area in a dielectric, for example oxide material, wherein the permanently magnetizable magnetic field sensor structure is preferably arranged within a passivation layer, e.g. a plasma nitride layer. Furthermore, vias for connecting the magnetic field sensor structure to a metal layer of the metal layer stack are possible.

It may be noted that the metal layer stack with the xMR layer structure may be manufactured in substantially technology-independent manner. The metal layer stack with the xMR-layer structure may thus be integrated onto the chip passivation above the active chip area in vertical integration or without active circuit and without routing in horizontal integration.

The wiring of the xMR magnetic field sensor structure may take place above the xMR magnetic field sensor structure by introducing an additional metal plane or on a metal plane already present by the interconnects or vias. Below the xMR layer stack, on the metal layer, a metallic protection plate, for example, is allowed for, which on the one hand protects the underlying logic circuits in the active chip area from the laser light in a laser writing process and on the other hand balances the temperature gradients, which may exert a strong influence on the accuracy on the xMR magnetic field sensor structure by causing an offset signal.

The metal planes of the metal layer stack may themselves also be embodied as lightproof shields. In this, it is to be noted that the metal planes of the metal layer stack may be embodied as current conductor structures for contacting different sensor structure portions, for example, with certain parts of the integrated circuit arrangement (e.g. via vias). These individual current conductor structures, however, must not abut each other and hence are preferably separated from each other by an insulation layer. This insulation layer is, however, generally translucent. So as to not put the underlying active circuits in the semiconductor material at risk by incident laser light in the writing procedure, additional metal plates or also other opaque arrangements, which are disposed directly under the clearances or gaps in the metal layer plane (in the layout), should be introduced on one of the metal layers. It may be possible that a metal plane or also a combination of several metal planes forms the shield lightproof with reference to the laser light wavelength used.

Corresponding to this embodiment, arrangements are considered lightproof or opaque if the same have non-transparent or at least radiation-absorbing (radiation-attenuating) or radiation-reflecting properties in the employed wavelength range.

In the following, with reference to FIGS. 1a-c, a first embodiment of a magnetoresistive sensor module and the corresponding method of manufacturing the same will now be explained in detail.

FIG. 1a shows a schematic cross-sectional illustration through a magnetoresistive sensor module 100 according to a first embodiment. The magnetoresistive sensor module 100 includes a semiconductor substrate 102, e.g. of silicon and/or polysilicon material with a first main surface 102a, wherein a semiconductor circuit arrangement 104 is integrated adjacent to the main surface 102a of the semiconductor substrate 102 into the same. According to an embodiment, the semiconductor circuit arrangement 104 integrated into the semiconductor substrate 102 may substantially be manufactured by means of arbitrary MOS and bipolar techniques or combinations of these techniques (BiCMOS processes), wherein the integrated circuit arrangement 104 may comprise both active devices, such as transistors, and passive devices, such as diodes, resistors, and capacitors.

It may be noted that the inventive concept is indeed exemplarily explained on the basis of a magnetoresistive module 100, but with the concept also being advantageously applicable to methods for the mass production of magnetoresistive sensor modules on wafer level with a multiplicity of magnetoresistive devices.

The magnetoresistive sensor module 100 illustrated in FIG. 1 comprises an insulation layer 106 (ZOX=Zwischenoxid=intermediate oxide) above the semiconductor substrate and the semiconductor circuit arrangement 104 integrated therein, corresponding to conventional semiconductor manufacturing processes. The insulation layer 106 may for example have a thickness on the order of 0.1 and 2 µm, and preferably in a range of about 0.5 µm. On the insulation layer 106, which preferably comprises oxide material, a metal-insulator arrangement 108 consisting of at least one metal sheet 108a and an insulation layer 108b (at least partially) surrounding this metal sheet 108a is arranged.

A magnetoresistive sensor structure 110 is applied on the metal-insulator arrangement 108 on an (outwardly) exposed area of the insulation material 108b. The thickness of the magnetoresistive sensor structures 110 ranges from about 2 to 200 µm, and preferably about 50 nm. In the scope of the present description, all xMR structures are understood as magnetoresistive structures or sensor structures, i.e. particularly AMR (anisotropic magnetoresistance) structures, GMR (giant magnetoresistance) structures, CMR (colossal magnetoresistance) structures, EMR (extraordinary magnetoresistance) structures, and TMR (tunnel magnetoresistance) structures, as well as magnetoresistance structures and spin valve structures. Here, it is to be noted that the above enumeration is not to be viewed as comprehensive, wherein substantially all magnetoresistive structures and elements can be employed, wherein the concept can be employed in especially advantageous manner for GMR and TMR sensor modules and for spin valve structures, in particular.

As illustrated in FIG. 1, the metal sheet 108a is preferably connected to connecting areas on the integrated semiconductor circuit arrangement 104 via vias 112. Furthermore, electrically conductive vias 112 are arranged between the structured metal sheet 108a and preferably connecting areas of the magnetoresistive sensor structure 110, so that preferably an electrical connection of the magnetoresistive structure 110 with default connecting areas of the active circuit arrangement 104 can be made.

Furthermore, as shown in FIG. 1 with reference to the magnetoresistive sensor module 100 illustrated there, a covering, completing cap layer arrangement 114 is optionally arranged on the metal-insulator arrangement 108 and the magnetoresistive sensor structure 110 arranged thereon.

As already indicated previously, the course of the process for the manufacture of the active and passive devices of the circuit arrangement 104 in the semiconductor substrate 102 is dealt with in the front part of the overall manufacturing process (FEOL=front end of line). In the BEOL (back end of line) part of the overall process, the individual devices are now connected to each other so that the desired magnetoresistive sensor module 100 is obtained.

In order to protect the magnetoresistive sensor module 100 illustrated in FIG. 1 according to an embodiment with the integrated circuit arrangement 104, the metal sheet 108a, and the magnetoresistive sensor structure 110 against corrosion and mechanical damage, after the structuring or after the structured application of the magnetoresistive sensor structure 110, a passivation layer arrangement 114 may optionally be applied, which is opened only at those locations at which optional connecting wires (bond wires; not shown in FIG. 1) can be attached at pads (not shown in FIG. 1). The passivation layer arrangement 114 may for example consist of an oxide, e.g. plasma oxide, or a nitride, e.g. plasma nitride, each with a layer thickness of about 0.1 to 5 µm, and preferably from about 0.3 to 1 µm. But double layers of oxide and/or nitride materials with the above layer thicknesses are also possible. The metal sheets preferably have a thickness of about 0.1 to 2.5 µm, and preferably from about 0.35 to 0.55 µm.

For contacting the magnetoresistive sensor structure, the metal sheet 108a of the basic process (i.e. prior to applying the magnetoresistive sensor structure 110) is now provided with vias 112 through the insulation layer 108b, wherein the vias are filled with metal, e.g. tungsten, and the surface is planarized flush with the insulation layer 108b. Then, the magnetoresistive sensor structure is applied and structured. Of course, it is also possible that the magnetoresistive sensor structure is applied in already structured manner. Optionally, then the passivation layer arrangement 114 is applied, wherein here a further anneal procedure may additionally take place, which should, however, be compatible with the magnetoresistive sensor structure already applied, i.e. the anneal temperatures should be (considerably) lower than the blocking temperature of the magnetoresistive sensor structure 110. Finally, now optional contact pads may be opened on the metal sheet 108 or also on the magnetoresistive sensor structure 110 with a standard process of the basic semiconductor manufacturing process.

The above explanations make clear that, for cost and performance reasons, it is extremely advantageous to integrate the magnetoresistive sensor structures 110 together with the evaluating/driving electronics 104 on a chip 102. For maximum compatibility with the semiconductor manufacturing process, according to the present manufacturing method according to an embodiment, it is now possible to enable also vertical integration of the entire magnetoresistive sensor module 100, i.e. the magnetoresistive structures (GMR or TMR structures) can be positioned above the electronic devices 104, wherein partly necessary additional passivation layer arrangements with a photosensitive polyimide material (PI=photoimide) can be implemented, as this will be clearly illustrated in the following at further preferred embodiments. Passivation layers, such as oxide/nitride passivation material and/or polyimide additional passivation layers, very frequently are an important constituent of integrated circuitries to be accommodated in a package, in order to noticeably increase the adhesion between the package and the chip surface. A cover layer arrangement 114 (oxide/nitride passivation layer) often has a thickness of 0.1 to 2 μm, and preferably ranging from about 0.3 to 1.0 μm, whereas an additional cover layer arrangement (polyimide additional passivation) has a thickness of typically between 1 μm and 10 μm, and preferably between 2.5 μm and 5 μm.

The subsequent description will show how in a semiconductor manufacturing process of a magnetoresistive device according to an embodiment a high, fabrication-suited yield for magnetoresistive sensor modules can be attained by preventing that the electronic devices 104 lying below the magnetoresistive sensor structure 110 are compromised by laser irradiation during the conditioning process on the one hand, and by the launched radiation power, e.g. laser power, having no significant effects on the manufacturing process of a magnetoresistive device by layer thickness variations of the cover layer arrangements above the magnetoresistive sensor structures 110, i.e. between the magnetoresistive sensor structure 110 and a laser light source, on the other hand. In particular, this is advantageous if it is to be achieved that no significant effects through layer thickness variations are to be registered over an entire wafer and also from wafer to wafer in the processing.

At first, the entire bandwidth from the UV (ultraviolet) region to the IR (infrared) region is suitable as laser wavelength for the conditioning of the magnetoresistive structures 110, but wherein rather more long-wave laser light should be applied due to the optical properties of common passivation layers 114, in order to keep light absorption in the passivation layer as low as possible. Due to the good availability in the market, for example, an Nd:YAG laser emitting light at a wavelength of $\lambda=1064$ nm in its basic radiation mode is suited in particular, but wherein also the first harmonic mode at a wavelength $\lambda=532$ nm is also possible.

With reference to the present invention, it should, however, become obvious that arbitrary radiation or light sources may substantially be employed for emitting radiation or light, which can heat sufficiently small structures to a desired temperature in targeted manner with a sufficiently high area resolution. In particular, light sources are suitable for emitting substantially monochromatic radiation (e.g. with a half width of $\Delta\lambda<0.1$ nm), wherein suitable light sources may also include semiconductor lasers, solid-state lasers, gas lasers or also LED elements, apart from Nd:YAG lasers.

As will still be shown clearly in the subsequent explanations, different "optical" properties of the magnetoresistive sensor module, which may be seen as a complex thin-layer system in its entirety and in connection with the conditioning, result depending on the wavelength of the emitted radiation, i.e. for example depending on the laser wavelength λ, during the conditioning of the magnetoresistive structures 110.

In the following, details of the procedure will be explained, how the connection between the emitted light wavelength and the cover layer arrangement 114 covering the magnetoresistive sensor structure 110 can be taken into account according to an embodiment with reference to the resulting absorption properties of the magnetoresistive sensor structure 110. The following explanations will show that high process safety in the procedure for manufacturing a magnetoresistive device can be achieved according to an embodiment.

With reference to the subsequent explanations, it is to be noted that it is at first assumed that the arrangement of an magnetoresistive sensor module 100 illustrated in FIG. 1 only comprises one cover layer arrangement 114, which is formed of a common oxide and/or nitride passivation material (plasma oxide and/or plasma nitride), but that (as of yet) no additional passivation (e.g. a photosensitive polyimide) has been arranged.

It can be further noted that a substantially "perpendicular" irradiation of the emitted radiation onto the magnetoresistive sensor structure 110 is substantially assumed in the irradiation of the emitted radiation into the magnetoresistive sensor module. It should become obvious, however, that also an "oblique" irradiation of the emitted radiation with reference to the surface of the magnetoresistive sensor structure 110 is equally possible and applicable according to the concept. The irradiated light is illustrated as an optical train A in FIG. 1, for example.

Figure 1B:
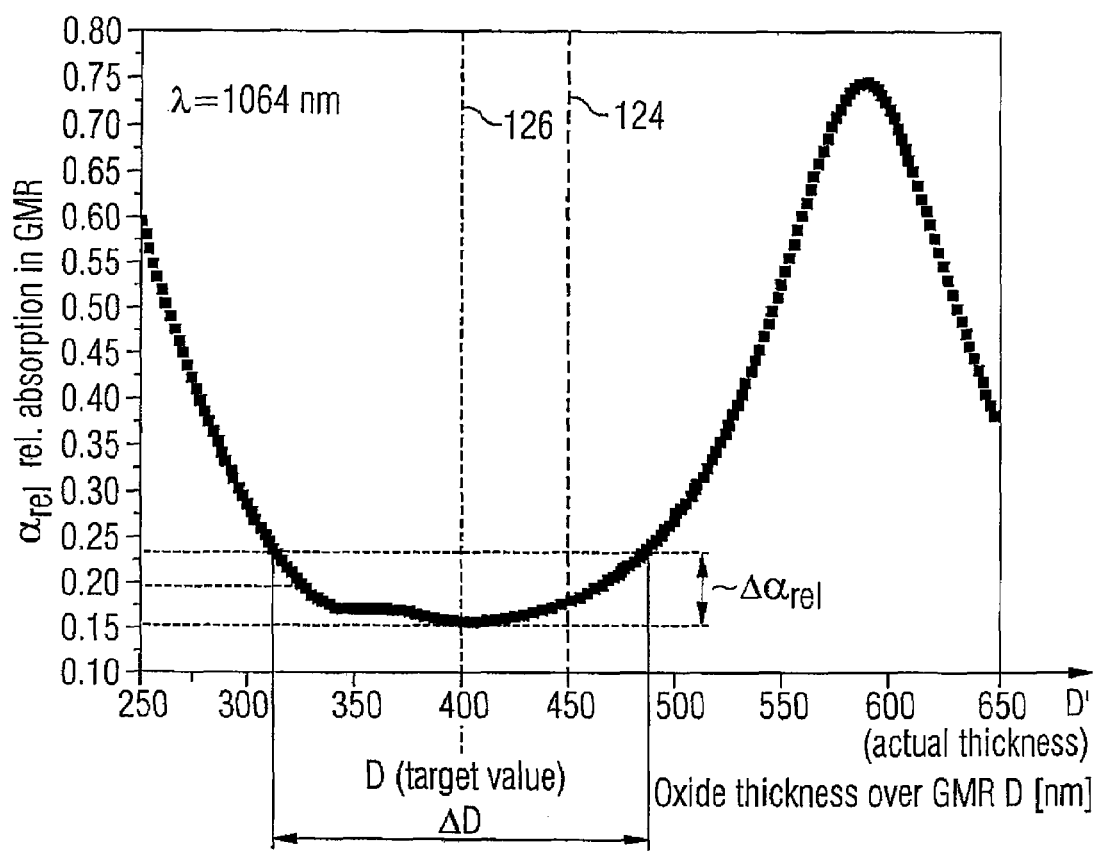

FIG. 1b shows the course of a relative absorption $\alpha_{rel}$ of an emitted radiation absorbed in the magnetoresistive sensor structure 110 with a wavelength λ of 1064 nm as a function of the actual thickness D' of the oxide of the oxide/nitride cover layer arrangement 114, which includes one sheet of oxide 114a and a further sheet of nitride 114b, for example, in the present case, at fixed nitride thickness on the magnetoresistive sensor structure 110, with reference to the optical train A illustrated in FIG. 1a.

With reference to the arrangement of the sensor module 100 illustrated in FIG. 1a, the thickness D' of the oxide of the cover layer arrangement 114 is related to the actual thickness above the magnetoresistive sensor structure 110. Due to the low layer stack thicknesses of the magnetoresistive sensor structure 110, it may, however, almost be assumed that the entire cover layer arrangement 114 also has constant layer thickness D, so that the surface profile of the cover layer arrangement 114 may be regarded as relatively level.

FIG. 1b shows the course of the relative absorption in the magnetoresistive sensor structure 110 in a range for the thickness D of the oxide of the cover layer arrangement 114 of about 250 nm to 650 nm, wherein the center of this thickness range at 450 nm is illustrated with the dashed line 124.

As the illustration in FIG. 1b shows, the power of the radiation emitted from a light source, which is absorbed in the magnetoresistive structure 110, strongly depends on the actual thickness D' of the oxide of the cover layer arrangement 114 on the magnetoresistive sensor structure 110 at the wavelength of λ=1064 nm. So as to obtain a maximum layer thickness variation ΔD around a target value of the layer thickness D of the cover layer arrangement 114 on the magnetoresistive sensor structure 110 in accordance with an embodiment, without the launched power changing significantly, and thus lying within a tolerance range, the target thickness D of the cover layer arrangement 114 is adapted such that the target thickness D lies at about the center of a plateau region of the absorption behavior of the magnetoresistive structure 110, as this is indicated by the dashed line 126 in FIG. 1b. According to an embodiment, hereby a working point optimized and stable with reference to layer thickness variations with reference to the actually obtained thickness D' of the cover arrangement 114 on the magnetoresistive structure 110 is obtained.

In the example illustrated in FIG. 1b, a reduction in the thickness D of the cover layer arrangement 114 from a value of 450 nm (dashed line 124 in FIG. 1b) to a thickness value of about 400 nm, which is indicated by the dashed line 126 in FIG. 1b, would noticeably increase the range of possible layer thickness variations ΔD. In order to achieve a variation of the laser power dissipated in the magnetoresistive structure 110 of typically less than 40% and preferably less than 25%, it is possible, with reference to the illustration in FIG. 1b, for example, to accept a variation in the thickness D of the cover layer arrangement 114 of about ±25% (corresponds to about ±80-90 nm). In general, this may be achieved without any problems, since deposition processes of passivation materials usually have a tolerance of less than 20% and typically of less than 10% of the deposited layer thickness.

In order to achieve a given maximum power variation of the radiation power absorbed in the magnetoresistive sensor structure of preferably less than 25% with reference to the mean value of the radiation power taken up per unit area of the magnetoresistive sensor structure 110, variations in the actual thickness D' of the cover layer arrangement 114, i.e. the oxide/nitride passivation layer, of about ±80-90 nm (±20%) may thus be permitted, which can easily be guaranteed in standard deposition processes.

The determination and adaptation of the target thickness D of the oxide of the cover layer arrangement 114 to an as-optimal-as-possible, stable working point 126 is now performed here so that the spectral reflection and/or absorption behavior of the magnetoresistive structure 110 (layer stack) is at first taken up (compare for FIG. 1b), whereupon the target thickness D of the oxide of the cover layer arrangement 114 is determined via an equalization of the measurement data with optical simulation data. Thereupon, on the basis of optical simulation data, an optimum thickness D (target thickness) of the oxide of the cover layer arrangement 114 is determined.

Thus, according to an embodiment, the target thickness for the cover layer arrangement 114 is preferably set in a range of a local extreme value of the course of the relative absorption over the layer thickness D.

Figure 1C:
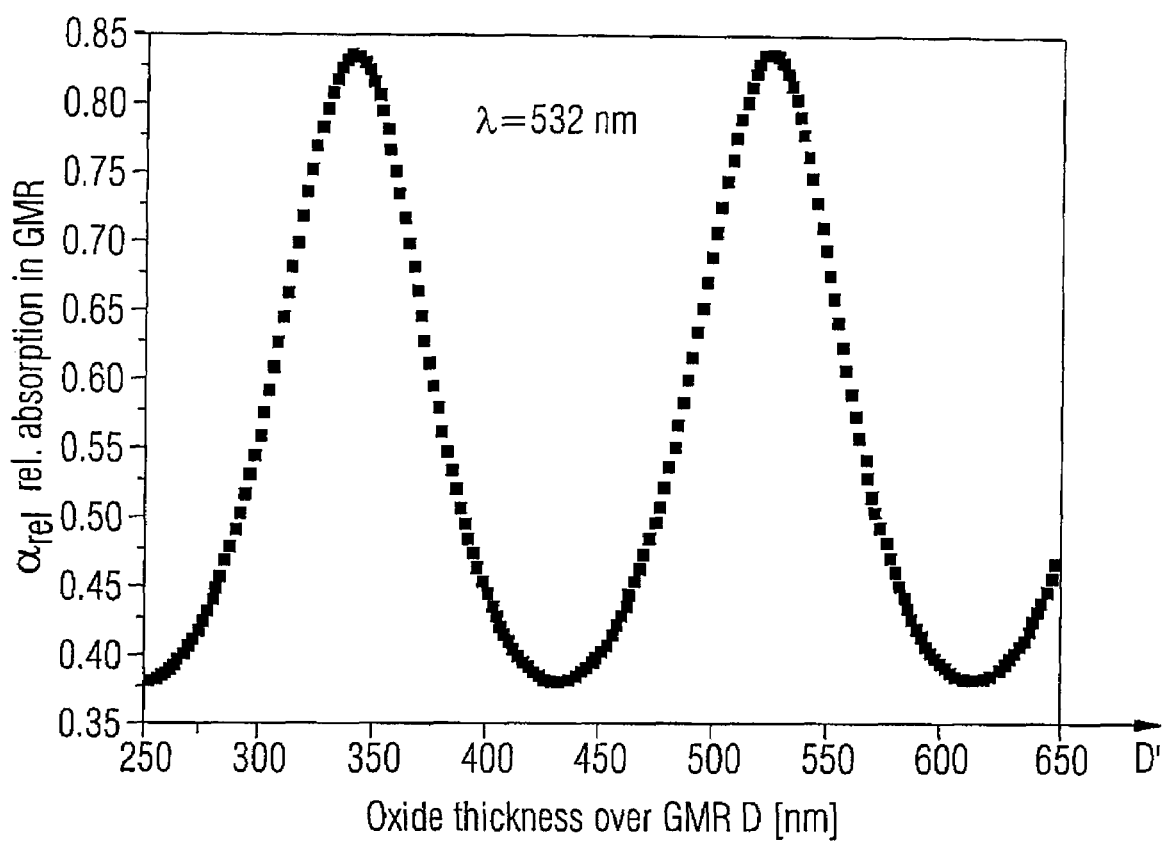

FIG. 1c shows an exemplary, schematic illustration of the relation of the relative absorption of laser light radiation in the magnetoresistive sensor structure 110 versus the actual layer thickness D' of the cover layer arrangement 114 at a laser wavelength of 532 nm. From the relation illustrated in FIG. 1c, it becomes obvious that the "plateau regions" are relatively narrow there, i.e. the target thickness D for the cover layer arrangement 114 thus is to be set in a local minimum or maximum of the relative absorption over the layer thickness D, since the slightest change of the relative absorption $\alpha_{rel}$ with reference to layer thickness variations ΔD is still present there after all.

From the illustration shown in FIG. 1c, it can thus be seen that either an altered or adapted light wavelength for the irradiated light should be used, for example, to obtain wider maxima or minima regions of the plateau regions, or that a passivation application process is used, in which relatively low layer thickness variations ΔD of the applied passivation layer(s) can be achieved.

Furthermore, it is of course also possible to choose the respective material for the cover layer arrangement 114 (passivation layer) such that marked plateau regions develop. In particular, it is pointed out that cover layer arrangement 114 is not limited to the preceding embodiment of a double layer of oxide and nitride. In particular, the layer 114 could be a uniform layer, in which case D' in the figures would extend across the entire layer arrangement 114. If D' is defined in this manner, the target layer thickness preferably ranges from 100 to 2000 nm, and even more preferably ranges from 400 nm to 1200 nm.

From the above explanations, it becomes clear that, by the optical examination of the absorption and/or reflection behavior of the overall layer system consisting of cover layer arrangement 114 (passivation layer) as well sensor structures 110, extremely positive effects for the manufacturing process of magnetoresistive sensor modules can be obtained. With reference to the choice of the materials to be used, i.e. particularly with reference to the passivation materials and the magnetoresistive sensor materials, as well with reference to the choice of the wavelength of the radiation sources to be used, extremely exact statements can be made, so that in the manufacture of magnetoresistive sensor modules these marginal parameters can be employed in extremely advantageous manner or optimized.

Hence, by the procedure with reference to the optical examination of the absorption and/or reflection behavior, an extremely high yield in the manufacture of magnetoresistive sensor modules is guaranteed, so that an extremely favorable cost factor can be achieved.

Furthermore, very high-quality magnetoresistive sensor modules can be obtained with the procedure, since the magnetoresistive properties of the individual magnetoresistive sensor structures are extremely exactly adjustable and thus conditionable also on wafer level, in particular.

In the following, with reference to FIG. 2a, a further embodiment of a magnetoresistive sensor module 200 will now be explained. For simplification of the following description, functionally like functional elements in FIG. 2a have the same reference numerals as in FIG. 1a, wherein repeated description of these features is omitted. Furthermore, all above explanations with reference to the functional elements illustrated in FIG. 1a are equally applicable to the corresponding functional elements in FIG. 2a.

Figure 2A:
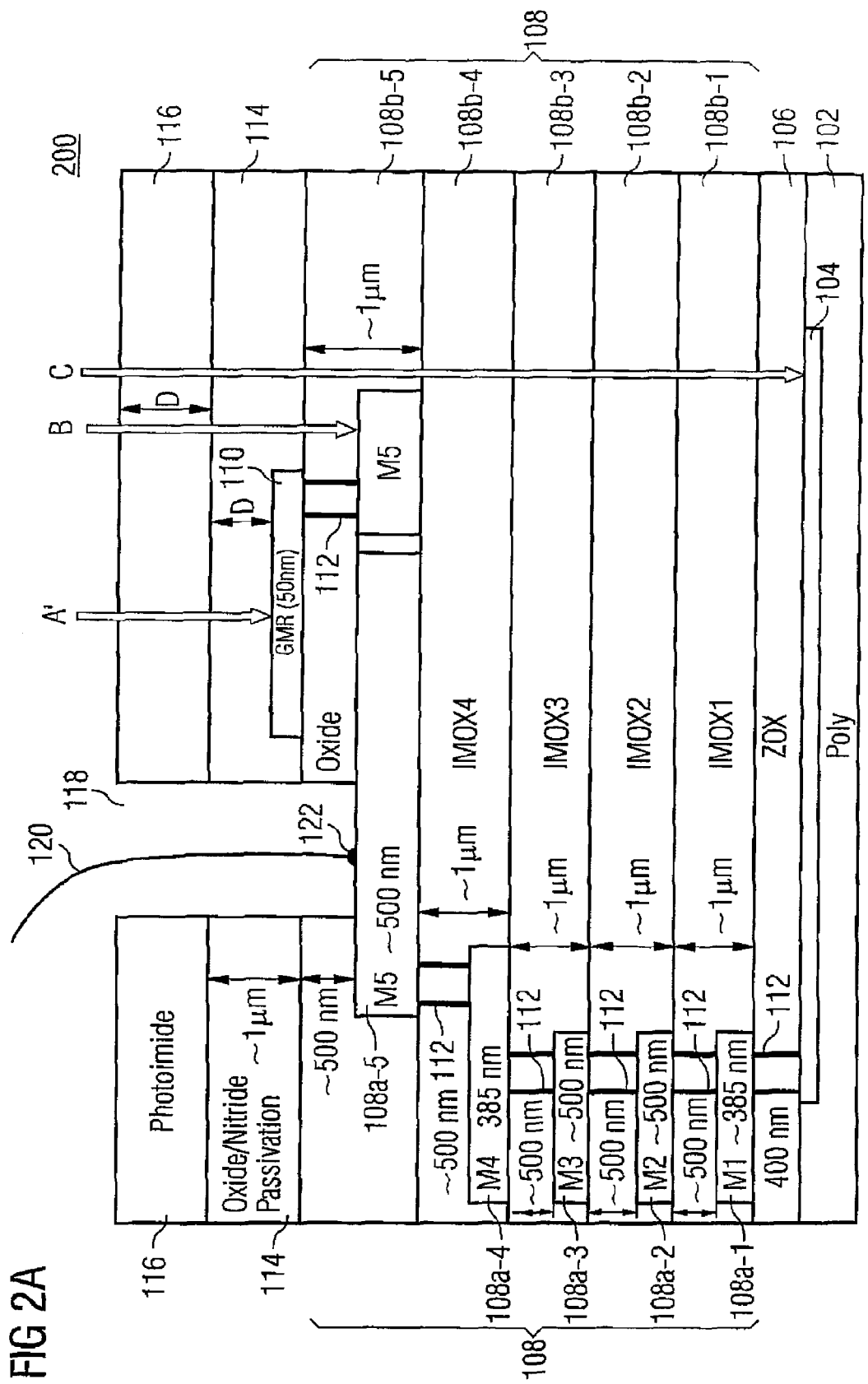
FIGS. 2*a-b* are a schematic cross-sectional illustration of a magnetoresistive sensor module according to a further embodiment of the present invention and an accompanying illustration of the relative absorption $\alpha_{rel}$ of radiation with a wavelength (λ=1064) in a magnetoresistive structure as a function of the thickness of a further cover layer arrangement (photoimide) over the cover layer arrangement of the magnetoresistive structure.

As can be seen in the magnetoresistive sensor module illustrated in FIG. 2a, for example, it comprises five metal sheets 108a-1 to 108a-5, which are also designated with M1-M5. Furthermore, the additional passivation layer 116 is illustrated in FIG. 2a. Furthermore, an opening 118 for an optional bond wire 120 with a bond contact is illustrated in FIG. 2a.

The above explanations explained in FIG. 1a thus are substantially also applicable to the magnetoresistive sensor module 200 illustrated in FIG. 2a.

In the magnetoresistive sensor module illustrated in FIG. 2a, the basic process of the basic semiconductor manufacturing process is also processed up to the last metal sheet 108a-5 (M5), wherein then at this point in time also an anneal process may be performed. So that the magnetoresistive sensor structure 110 to be applied later can be electrically insulated, an insulation layer 108b-5 is further applied on the last metal sheet 108a-5, which insulation layer (at least partially) surrounds the same. It is to be noted that the first four metal sheets 108a-1 to 108a-4 also each comprise (at least partially) surrounding insulation areas 108b-1 to 108b-4.

If the topmost insulation layer 108b-5 has uneven areas for manufacturing reasons, for example, and should therefore be planarized to produce a defined and planar surface for the magnetoresistive sensor structure 110 still to be applied, a CMP treatment of the surface of the insulation layer 108b-5 can also be performed here. For contacting the magnetoresistive sensor structure still to be applied, the last metal sheet 108a-5 of the basic process is provided with vias 112 through the insulation layer 108a-5, wherein the created vias are filled with metal, e.g. tungsten, and the surface thereof is planarized preferably flush with the surface of the topmost insulation layer 108b-5. Thereupon, the magnetoresistive sensor structure 110 is applied and structured. Finally, a suitable passivation arrangement 114, 116 is optionally applied, which for example comprises an oxide/nitride passivation layer 114 and an additional passivation layer 116 of a photoimide material. At this time, an additional anneal process may also take place here, which should, however, be compatible with the magnetoresistive sensor structure already applied. To conclude, so-called connecting pads 122 are opened with the standard process of the basic manufacturing process, so that the magnetoresistive sensor module 200 illustrated in FIG. 2a may for example be connected to a lead frame (not shown in FIG. 2a) of a device package by means of optional bond wires 120.

As can be seen from FIG. 2a, the cover layer arrangement 114 has a thickness D, wherein the additional cover layer arrangement 116 has a thickness $D_1$. With reference to the arrangement of the sensor module 100 illustrated in FIG. 2a, the thickness $D_1$ of the additional cover layer arrangement 116 thus is related to the thickness above the magnetoresistive sensor structure 110. Due to the small layer stack thicknesses of the magnetoresistive sensor structure 110 it may, however, approximately be assumed that the additional cover layer arrangement 116 also has a constant layer thickness $D_1$, so that the surface profile of the additional cover layer arrangement 116 may also be regarded as relatively flush.

Furthermore, in FIG. 2a three exemplary optical trains A', B, and C are illustrated, which illustrate the optical trains of the radiation emitted from a radiation source into the magnetoresistive sensor module 200 of FIG. 2a.

The optical train A' is supposed to illustrate emitted radiation impinging on the magnetoresistive sensor structure 110 after passing through the cover layer arrangement 114 and the additional cover layer arrangement 116. The optical train C is supposed to illustrate irradiated light missing the magnetoresistive sensor structure 110 and impinging on the metal sheet (M5) 108a-5. The optical train C is supposed to illustrate light irradiated into the magnetoresistive sensor module 200, which light passes through the entire composite arrangement of magnetoresistive sensor structure 110 and the metal-insulator arrangement 108 and impinges on the sensitive semiconductor circuit arrangement 104 in the semiconductor substrate 102.

Figure 2B:
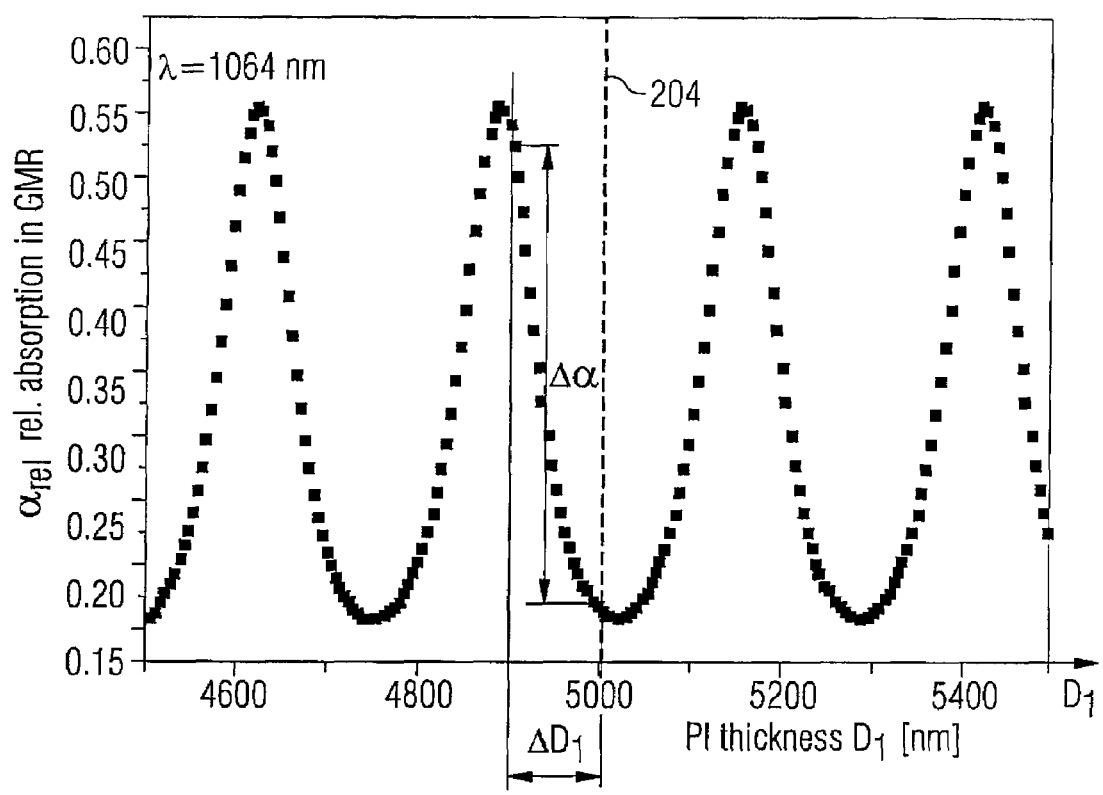

FIG. 2b exemplarily shows the relative absorbed laser power $\alpha_{rel}$ (in %) in the magnetoresistive structure 110 as a function of the thickness $D_1$ of the additional cover layer arrangement 116 (photoimide passivation), which is applied in addition to the cover layer arrangement 114 (oxide/nitride passivation), at a laser light wavelength $\lambda$=1064 nm. The illustration of the relative absorption shown in FIG. 2b thus is associated with the optical train A' illustrated in FIG. 2a.

As can be seen from the illustration of FIG. 2b, relatively small (percentage) thickness variations $\Delta D_1$ of the thickness $D_1$ of the additional cover layer arrangement 116, for example in an order of magnitude of about 100 nm based on a thickness $D_1$ of 5000 nm ($\Delta D$=2%), which is illustrated by the dashed line 204, already lead to a variation in the relative absorption $\Delta\alpha_{rel}$ of more than 300% (>factor 3) with reference to the power launched into the magnetoresistive sensor structure 110.

Since photoimide layers, which are typically employed for the additional cover layer arrangement 116, are often applied within the scope of a so-called spin coating process in which also layer thickness variations of the applied polyimide layer in the order of magnitude up to 10% may occur, applying such an additional cover layer arrangement 114 as a photoimide material layer is relatively critical, unless one of the relative minima or maxima illustrated in FIG. 2b can be hit with relatively high accuracy, i.e. with relatively small layer thickness variations of less than 1%.

For example, if the second cover layer arrangement 116 (e.g. a photosensitive polyimide material=photoimide material) cannot be produced with exact thickness $D_1$ and relatively small variation in the layer thickness $D_1$ for procedural reasons, it is now proposed, according to an embodiment, in order to keep the relative absorption of the emitted light radiation in the magnetoresistive sensor structure 110 as constant as possible within a tolerance range, that the additional cover layer arrangement 116 necessary in many technologies be removed within the scope of a standard machining process in the areas illuminated in the laser magnetization process (conditioning) of the magnetoresistive sensor structures 110 with a radiation source (laser). Thus, the magnetoresistive sensor structure 110, apart from the cover layer arrangement 114, is exposed, so that the optical characteristics as described in the FIGS. 1a-c can be obtained. Thus, an optical behavior showing a behavior as a function of the oxide layer thickness of the oxide/nitride passivation with reference to the launched laser power (at $\lambda$=1064 nm) in the magnetoresistive layer stack 110, as this is shown in FIG. 1b with reference to the optical train A of FIG. 1a, can be achieved without the additional cover layer arrangement 116 above the magnetoresistive sensor structure 110. So as to permit maximum layer thickness variation, without the launched power changing significantly, the oxide layer thickness D of the passivation layer 114 is for example adapted such that approximately the center of the absorption plateau of FIG. 1b is hit.

In the following, with reference to FIG. 3, a further embodiment of an magnetoresistive sensor module 300 will now be explained. For simplification of the following description, functionally like functional elements in FIG. 3 have the same reference numerals as in FIG. 1a or 2a, wherein repeated description of these features is omitted. Furthermore, all above statements with reference to the functional elements illustrated in FIG. 1a or 2a are equally applicable to the corresponding functional elements in FIG. 3.

Figure 3:
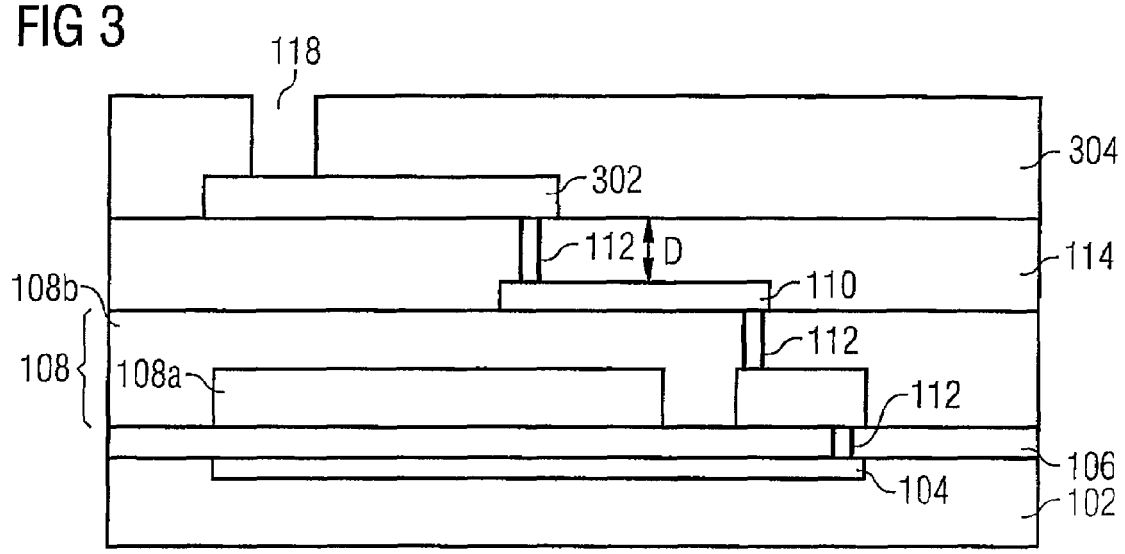
FIG. 3 is a schematic cross-sectional illustration of a magnetoresistive sensor module according to a further embodiment of the present invention.

As can be seen from FIG. 3, the magnetoresistive sensor module 300 illustrated there comprises a metal sheet 302 with an insulation layer 304 (at least partially) surrounding it. This metal sheet 302 is disposed opposite the first metal sheet 108a with reference to the magnetoresistive sensor structure 110, so that the magnetoresistive sensor structure 110 may be regarded as between the metal sheets 108a and 302. It should, however, become clear that, corresponding to the embodiment of the magnetoresistive sensor module 200 of FIG. 2a, a substantially arbitrary number of metal sheets 108a, i.e. starting from at least one metal sheet, may also be arranged here on the semiconductor substrate 102 and below the magnetoresistive sensor element 110. Furthermore, of course several metal sheets 302 may also be disposed above the magnetoresistive sensor structure 110 and also be structured, in order to form conductor structures, for example, if this is required.

In the present description, the terms "above" or "below" are to be referred to directions "in the drawing plane" of FIGS. 1a-3.

The arrangement of the magnetoresistive sensor module 300 illustrated in FIG. 3 obviously is especially advantageous for TMR sensor structure, since there the current direction may flow perpendicularly through the magnetoresistive structures. Thereby, a simplified electrical connection and coupling of the magnetoresistive sensor structure 110 may be achieved. However, it should also become clear that substantially all under the term "magnetoresistive sensor structures" can be electrically contacted with the additional metallization sheet 302 by means of additional vias 112.

In the embodiment illustrated in FIG. 3, it is thus only required to provide a further insulation layer 304 and also the additional metal sheet 302 in the manufacturing process after applying the magnetoresistive structure 110. On this arrangement, optionally a passivation arrangement or an additional passivation arrangement (not shown in FIG. 3) may now also be applied again, as already illustrated on the basis of FIGS. 1a and 2a. Furthermore, the optional passivation arrangement or additional passivation arrangement may be opened to expose connecting contacts 122 for optional contacting, for example, by means of bond wires on the additional metal sheet 302.

From the embodiments of the magnetoresistive sensor modules 100, 200 and 300 illustrated on the basis of FIGS. 1a, 2a and 3 and the accompanying manufacturing methods, it becomes clear that the concept for manufacturing an magnetoresistive sensor module according to the may be integrated into a conventional semiconductor manufacturing process of an integrated semiconductor circuit, wherein the magnetoresistive sensor structure may here either be placed between the last metal sheet of the basic manufacturing process and the passivation or may also be placed between two arbitrary neighboring metal sheets. The contacting of the magnetoresistive sensor structure may be achieved from underneath (with reference to the magnetoresistive sensor structure in direction of the semiconductor substrate) by the use of a standard inter-metal contact process (i.e. e.g. W plugs). Furthermore, contacting the magnetoresistive sensor element 110 may be obtained from above either by an additional metal layer 302 (cf. FIG. 3) or by an additional metal contact (via). The latter procedure is therefore particularly suited for TMR sensor structures.

Moreover, the procedure for manufacturing a magnetoresistive sensor module is advantageous in that a surface planarized with a CMP procedure and conditioned correspondingly, for example, is used as starting point and growth foundation for the magnetoresistive sensor structure, which is preferably embodied as an xMR layer stack. With this, according to an embodiment, a magnetoresistive sensor module integrated with an active circuit arrangement can be obtained.

Since mechanical tension differences in the various layers in the magnetoresistive sensor modules 100, 200, 300 illustrated in FIGS. 1a, 2a and 3 often cannot be avoided, insufficient sealing adhesion or tensions of the package molding compound may lead to cracks in the metallization layer (metal sheet 108a) and, if several metal sheets 108a are provided, above all in the topmost metallization layer as well as in the passivation layer arrangement 114. In order to remedy this problem, the passivation layer thickness will preferably be as great as possible, i.e. preferably greater than the thickness of the metal sheet 108a (or the topmost metal sheet 108a). Furthermore, relatively wide metal trace structures are slotted. Furthermore, it should be avoided that conductive traces are provided in the area of the outer chip corners. An additional polyimide layer, which may have a thickness of 0.5 to 10 µm and preferably from about to 1 to 5 µm, for example, has turned out to be especially effective. This additional passivation layer (not shown in FIG. 1) preferably is as a so-called stress relief and furthermore provides for excellent adhesion between the molding compound and the chip surface in an accommodation of the magnetoresistive sensor module in a package.

In the following, with reference to FIG. 4a, a further embodiment of a magnetoresistive sensor module 400 will now be explained. For simplification of the following description, functionally like functional elements in FIG. 4a have the same reference numerals as in FIGS. 1a-3, wherein repeated description of these features is omitted. Furthermore, all above statements with reference to the functional elements illustrated in FIGS. 1a-3 are equally applicable to the corresponding functional elements in FIG. 4a.

For the detection of an angle unique in 360°, GMR/TMR spin valve structures require several magnetoresistive individual elements, which are arranged in a Wheatstone bridge circuit, for example, and the reference magnetization of which may comprise up to four locally different directions. For adjustment of the respective reference direction of each magnetoresistive individual element, the spin valve layer system now has to be heated above the so-called "blocking temperature", which is up to 400° C. depending on the material system employed, and cooled again in a lateral magnetic field of the desired direction. For manufacturing a magnetoresistive sensor module in which all magnetoresistive sensor elements or sensor structures (e.g. bridge elements) are integrated on a chip, locally heating the respective elements is therefore required, without also heating neighboring elements above the "blocking temperature" during the magnetization procedure. For example, one possibility is locally illuminating with a laser light source with sufficient energy.

As it becomes obvious from the above statements on the embodiments of FIGS. 1a, 2a and 3, for cost and performance reasons, it is advantageous to (vertically monolithically) integrate the magnetoresistive sensor structure together with the electronic evaluating/control circuitry on the semiconductor circuit substrate. For highest compatibility with the fabrication process, it is now required to enable also vertical integration, i.e. position the magnetoresistive sensor structures above the integrated electronic semiconductor circuit arrangements, as well as to implement a partly necessary additional passivation with a photosensitive polyimide. The polyimide material often is a very important constituent to noticeably improve the adhesion between the package and the chip surface. The photoimide material typically is between 2.5 µm and 6 µm thick. In order to obtain fabrication-suited yield, the electronic semiconductor circuit elements underlying the magnetoresistive structures must not be affected by the laser irradiation on the one hand, wherein the launched laser power should not scatter significantly across the semiconductor substrate (wafer) and also from wafer to wafer by layer thickness variations of the layers between the magnetoresistive structures and the laser, for example, on the other hand.

A further aspect according to an embodiment consists in using a metal sheet of the metal/insulator arrangement 108 of a magnetoresistive sensor module 100, 200, 300 from FIGS. 1a, 2a and 3, respectively, for protecting the sensitive areas of the substrate material 104 from inadvertent influence of the radiation from a laser light source in the conditioning. One of the metal sheets may be embodied as lightproof shield so that the proportion of the radiation emitted from the light source not absorbed by the magnetoresistive structure 110 is shielded, so that inadvertent illumination of a sensitive area of the substrate material 104 lying in the extension of the optical train and potential damage of devices or circuit elements resulting therefrom is prevented.

Figure 4A:
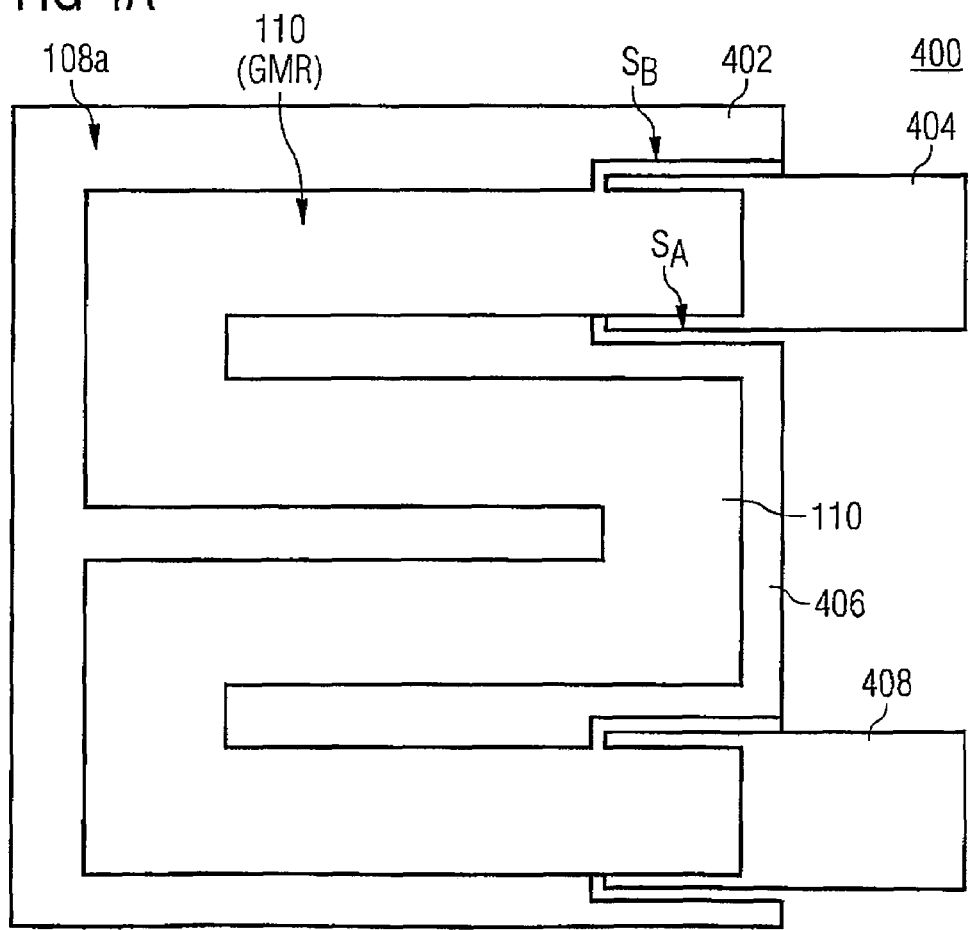
FIGS. 4*a-b* are a schematic illustration in top view onto a magnetoresistive sensor module according to a further embodiment of the present invention and a qualitative illustration of the relative absorption of radiation at the wavelength λ=532 nm in a semiconductor substrate material as a function of the overall thickness of the insulation material on the semiconductor substrate material.

FIG. 4a shows a schematic illustration of a top view onto a device according to a further embodiment, wherein FIG. 4a only shows a metal sheet 108a, which includes the areas 402 to 408 galvanically separated in the plane of the metal sheet 108a, and a magnetoresistive structure or GMR area 110, which substantially has a meander structure. Here, the metal sheet 108a, also referred to as M5 in FIG. 4a may match particularly the fifth metal sheet 108a-5 from FIG. 2a.

Figure 4B:
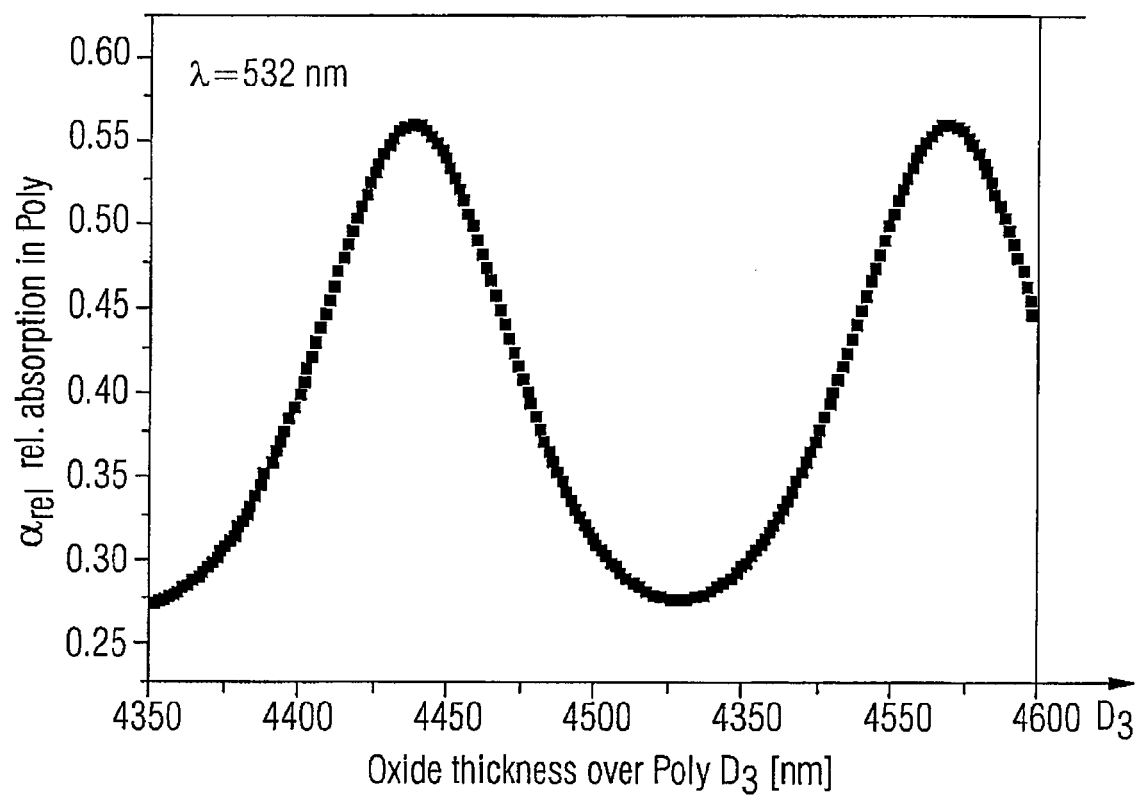
Figure 5A:
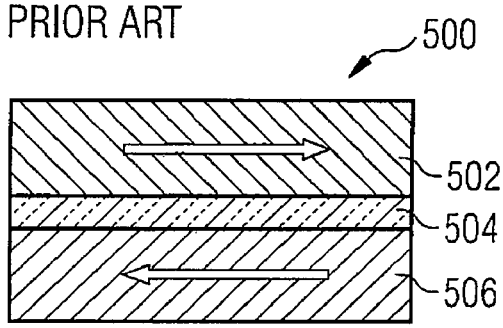
FIGS. 5*a-c* are schematic illustrations of the principle construction of various types of GMR sensor elements and the accompanying schematic illustration of the magnetic field dependence of the magnetization and the resistance of the magnetoresistive structure according to the prior art.
Figure 5B:
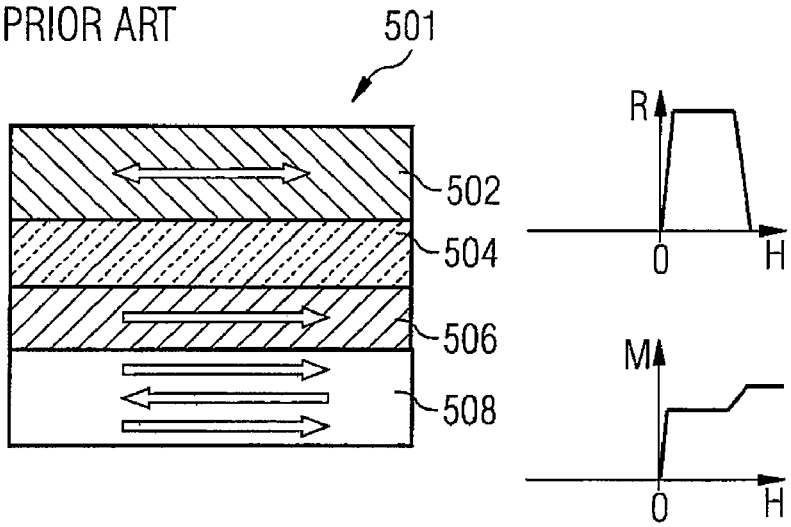
Figure 5C:
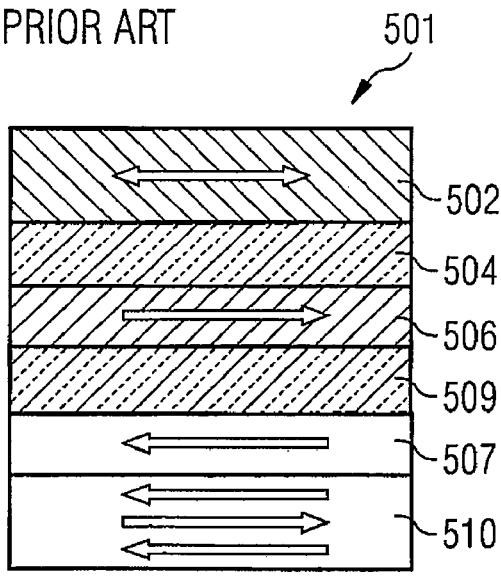
Figure 6:
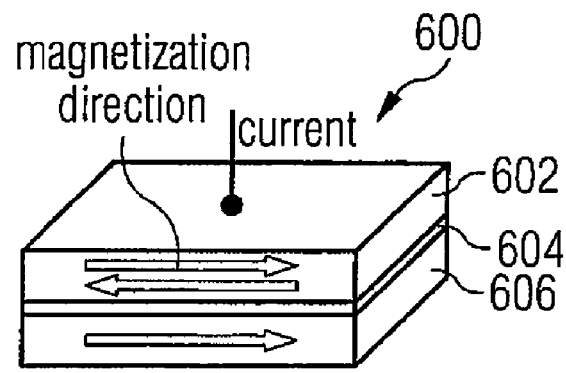
FIG. 6 is a schematic illustration of a magnetoresistive TMR sensor module.
Figure 7:
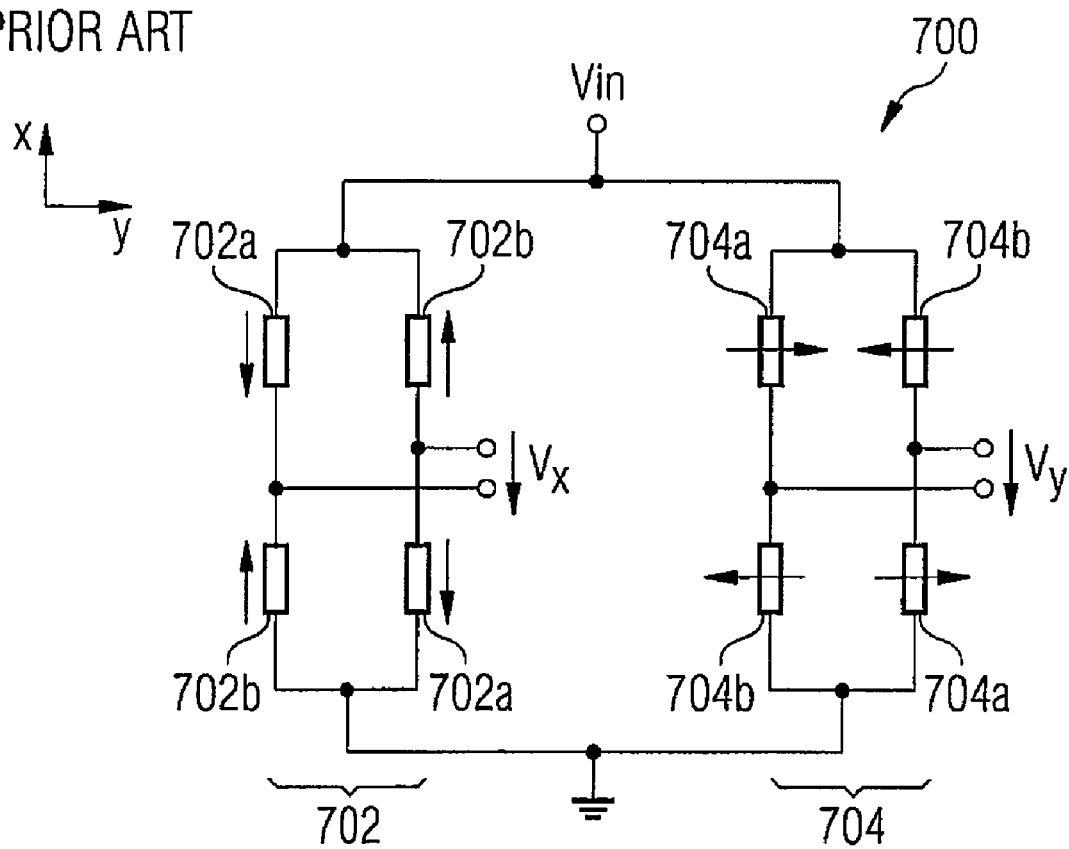
FIG. 7 is a principle illustration of a bridge circuit construction of a magnetoresistive sensor arrangement for angle determination of an external magnetic field according to the prior art.
Figure 8A:
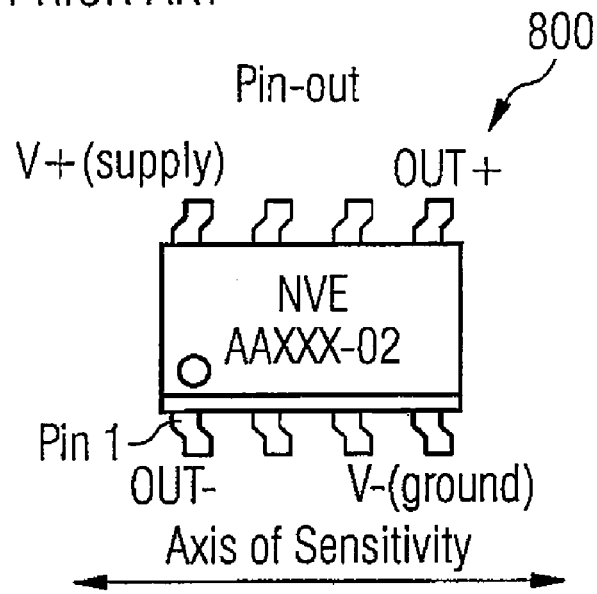
FIGS. 8*a-b* show a GMR package with pin assignment and a functional block diagram according to the prior art.
Figure 8B:
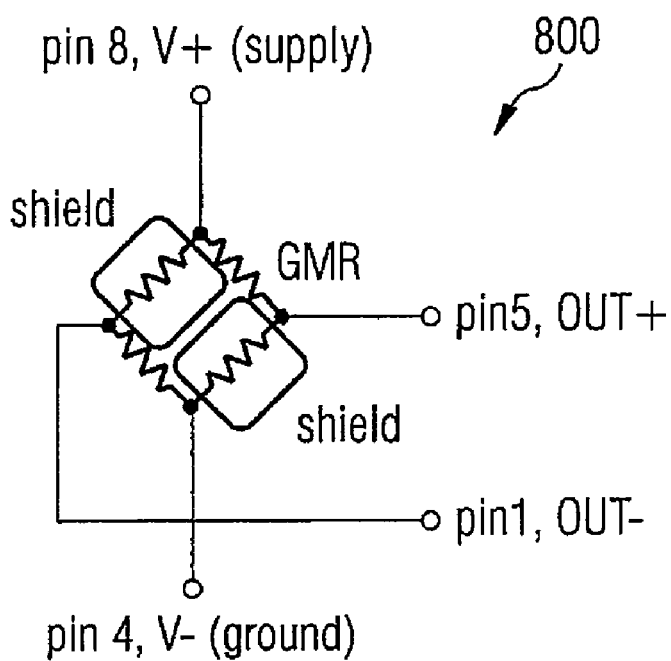

FIG. 4b shows the relative absorbed light power in the substrate material 102 as an example, when light of the wavelength λ=532 nm impinges on the semiconductor substrate 102 with the sensitive, integrated semiconductor circuit arrangement arranged there, past the magnetoresistive structure 110 as well as through all insulation layers of the metal-insulator arrangement 108. For example, this corresponds to the optical train C of FIG. 2a.

If integrated circuits 104 are below the magnetoresistive sensor structure 110, laser light (optical train C) not absorbed by the magnetoresistive sensor structure 110 might impinge on electrical devices almost unhindered by the underlying oxide layers of the metal-insulator arrangement 108 and lead to a significant heating thereof, which may result in damage or reduced reliability of the electrical/electronic devices. FIG. 4b shows the relative absorbed laser power in the semiconductor substrate 102 as an example, when laser light of the wavelength $\lambda=532$ nm impinges on a semiconductor structure past the magnetoresistive structure through all intermediate oxides (thickness about 4.5 μm). A comparison with the power deposited in the magnetoresistive structure at equal wavelength, as this is illustrated in FIG. 1c, shows that, depending on the thickness of the oxide layers involved, up to twice the power of radiation energy as compared with the magnetoresistive structure 110 can be introduced in the semiconductor substrate 102, which leads to significant heating and may thus lead to damage of the semiconductor circuitries integrated in the semiconductor substrate 102.

In order to prevent this, the metal plane 108a may here be used as lightproof shield and as feeding structure for the magnetoresistive structure 110 at the same time. In this case, however, recesses preventing shorting the magnetoresistive structure 110 via the metal plane 108a have to be provided in the metal plane 108a. For example, FIG. 4 shows two such recesses in the metal sheet 108a, which are designated with $S_A$ and $S_B$. In the embodiment shown in FIG. 4, the region 404 and the region 406 of the metal sheet 108a serve as terminal regions for the magnetoresistive structure 110, which is also referred to as GMR in FIG. 4.

Between the area 404 or 406 and the magnetoresistive structure 110, there is a metallic connection (via 112; cf. FIGS. 1a-3) passing substantially perpendicularly to the main surface of the substrate material and not shown in FIG. 4a for perspective reasons. The areas 404 and 406 of the metal sheet 108a, together with the areas 402 and 408, form a lightproof shield for sensitive areas of the substrate material, which lie in the further course of the optical train of the radiation emitted from the light source in the step of heating the magnetoresistive structure 110. Here, the metal sheet 108a includes at least a metal not transparent in the wavelength region of the radiation used, so that the radiation emitted by the light source and not absorbed by the magnetoresistive structure 110 is reflected or absorbed by the metal sheet 108a.

Here, the metal sheet 108a, apart from the function as lightproof shield, additionally fulfills the task to prevent additional heating of sensitive areas in the substrate material in the surroundings of the magnetoresistive structure by distributing the heat to a greater area of the composite arrangement due to the in general substantially better thermal conductivity of metals as compared with semiconducting or insulating materials. Hereby, the metal sheet 108a thus not only acts as a lightproof shield, but also as a heat barrier preventing or weakening the expansion of the heat deposited in the magnetoresistive structure 110 via thermal conduction to sensitive areas of the substrate material.

So that the metal plane 108a can be used as a lightproof shield and as a signal plane at the same time, in the present embodiment for contacting the magnetoresistive structure 110, like in the embodiment shown in FIG. 4a, the metal sheet must have recesses to prevent shorting of the magnetoresistive structure 110, as this has already been explained further above. In order to prevent the radiation emitted in the step of conditioning the magnetoresistive structure 110 from reaching sensitive areas of the substrate material lying in the further course of the optical train, the magnetoresistive structure 110 may comprise, apart from the actual meander structure of the magnetoresistive structure, such structures that cover the necessary recesses or gaps in the metal sheet 108a in the extension of the optical train of the radiation emitted from the light source.

FIG. 4a thus exemplarily shows a gap or a recess $S_A$ in the metal sheet 108a, which galvanically separates the areas 404 and 408 of the metal sheet 108a from each other. As FIG. 4a also shows on the basis of the gap labeled $S_B$, in the plane of the magnetoresistive structure and taking the optical train of the radiation emitted from the light source into account, a gap in the metal sheet 108a may be filled by magnetoresistive material or by a magnetoresistive layer system so that the plane of the magnetoresistive structure 110 forms a lightproof shield together with the metal sheet 108a.

In summary, it may thus be stated that FIG. 4a schematically shows an embodiment of the lightproof shield below a magnetoresistive or GMR meander structure, in which the shielding and the wiring of the magnetoresistive or GMR structure take place in the same metal plane 108a or M5. FIG. 2a shows the corresponding lightproof shield below the GMR structure in cross section. In the embodiment shown in FIG. 4a, the optical shield is embodied in the last metal plane $108a_{1-5}$ of a five metal sheet process. With simultaneous use of the fifth or last metal plane $108a_{1-5}$ for the contacting of the magnetoresistive structure 110 for the GMR/TMR wiring, the layout of the metal sheet $108a_{1-5}$, however, has to be chosen so as to have no "gaps" for the laser light preferably incident perpendicularly. FIG. 4a shows for this case that a gap $S_A$ has to be provided between the wiring area 404 and the shield area 408, in order to avoid shorting of the magnetoresistive structure or the GMR terminals. For optical shading of the underlying devices or a sensible area of the substrate material, this gap area $S_A$ can be filled with GMR material or a magnetoresistive layer system, as this is exemplarily shown at the gap designated as $S_B$, without significantly influencing the sensor properties of the magnetoresistive structure.

Thus, an individual metal plane or also a combination of several metal planes may form the shield lightproof with reference to the conditioning radiation used, so that as much radiation energy as possible is kept away from the sensitive semiconductor substrate. Here, at least so much radiation energy should be shielded that no (e.g. thermal) impairment or damage of the circuit arrangements integrated in the semiconductor substrate can occur.

With reference to the concept for manufacturing a magnetoresistive sensor module, it now also becomes clear that the implementation may be achieved in a CMOS/BiCMOS-compatible manufacturing fabrication procedure for attaining fabrication-suited local laser conditioning of integrated magnetoresistive sensor elements and particularly GMR and TMR sensor elements with high yield, because the structured metal sheets of the metal-insulator arrangement, i.e. the metal layer stack above the semiconductor circuit substrate, may provide a lightproof shield below the magnetoresistive structure by the fact that the metal planes underlying the magnetoresistive sensor structure are embodied or structured corresponding to the irradiation angle of the laser irradiation (preferably a perpendicular incident angle) so that inadvertent illumination of the semiconductor circuit areas lying below the magnetoresistive sensor structures on the integrated semiconductor circuit substrate and its possible damage due to the laser irradiation can be prevented.

The concept for manufacturing a magnetoresistive sensor module thus offers a series of advantages.

The method for integration of a magnetoresistive sensor structure with an active semiconductor circuit arrangement may thus be built into every basic semiconductor manufacturing process with slight adaptations. The applied magnetoresistive sensor structure is disposed on a surface that is planar and to be conditioned independently of the basic semiconductor manufacturing process. With this, the ideally planar contact area between magnetoresistive sensor structure and contact pads allows for an extremely robust and reliable contacting of the magnetoresistive sensor structure, i.e. the xMR layer systems. Problems like tear-offs, thinning, etc. can be avoided. Furthermore, the active sensor layer, i.e. the magnetoresistive sensor structure 110, is not changed by an etching process from above.

Due to the small thickness of the magnetoresistive sensor structures in the range from about 2 to 200 nm, and preferably about 50 nm, the final passivation with the passivation arrangement 114 and/or the additional passivation layer 116 is further disposed on a largely planar surface and thus is tight in a large process window. Optionally, it is also possible that the last inter-metal connections (via) of the basic semiconductor manufacturing process are used as a sensor terminal, i.e. as a terminal of the magnetoresistive sensor structure.

Moreover, in the manufacturing method of a magnetoresistive sensor module, the final anneal procedure for the integrated process, i.e. the basic semiconductor manufacturing process, and for the magnetoresistive sensor module may take place independently, so that particularly the anneal process for the sensor module, which can be performed at low temperature, can be performed later without damaging the other integrated circuit parts, and, conversely, the anneal process for the remaining integration, which takes place at high temperatures, can be performed prior to the production of the sensor module, so that no disturbance or destruction of the sensor module occurs.

Thus, it becomes clear that substantially only standard semiconductor manufacturing processes are required for the method of manufacturing a magnetoresistive sensor module. The resulting magnetoresistive sensor module may be put on the active integrated semiconductor circuit in space-saving manner, wherein this is referred to as vertical integration in this connection.

Furthermore, at least one of the previously described metal sheets may be embodied below the magnetoresistive sensor structure as a lightproof shield, so that inadvertent illumination of the active circuit areas, underlying the magnetoresistive sensor structure, of the semiconductor circuit arrangement in the semiconductor substrate and its possible damage may thereby be prevented. With this, fabrication-suited local laser conditioning of integrated magnetoresistive sensor modules may be implemented with high yield in a CMOS/BiCMOS-compatible fabrication flow.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of manufacturing a magnetoresistive device, comprising:
   providing a composite arrangement with
     a substrate material with a main surface,
     a metal-insulator arrangement on the main surface of the substrate material, the metal-insulator arrangement including a metal sheet with an insulation area at least partially surrounding the metal sheet, and
     a magnetoresistive structure on the metal-insulator arrangement;
   applying a cover layer arrangement on the magnetoresistive structure, so that the cover layer arrangement at least partially covers the magnetoresistive structure with a target thickness D,
   heating the magnetoresistive structure by exposing the magnetoresistive structure to radiation emitted from a light source with given wavelength $\lambda$, wherein the magnetoresistive structure absorbs a portion of the emitted radiation;
   wherein the absorbed portion of the emitted radiation depends on an actual thickness D' of the cover layer arrangement and the wavelength $\lambda$ of the emitted radiation;
   wherein the target thickness D of the cover layer arrangement is adjusted so that, if in the step of applying the cover layer arrangement a deviation of the actual thickness D' from the target thickness D in a range of ±20% with reference to the target thickness D occurs for process reasons, a change of the absorbed portion of the emitted radiation in the magnetoresistive structure of less than ±40% is caused; and
   providing a magnetic field in a desired direction while at least partially cooling down the magnetoresistive structure after the heating of the magnetoresistive structure.

2. The method of claim 1, wherein the target thickness D of the cover layer arrangement is adjusted so that, if in the step of applying the cover layer arrangement a deviation of the actual thickness D' from the target thickness D in a range of ±10% with reference to the target thickness D occurs for process reasons, a change of the absorbed portion of the emitted radiation in the magnetoresistive structure of less than ±25% is caused.

3. The method of claim 1, further comprising:
   determining the target thickness D of the cover layer arrangement, further comprising:
     sensing the reflection and/or absorption behavior of the composite arrangement, depending on the actual thickness D' of the cover layer arrangement and the wavelength $\lambda$ of the emitted radiation; and
     determining a value or value range for the target thickness D of the cover layer arrangement, so that the absorbed portion of the emitted radiation is constant within a tolerance range with reference to a target layer thickness range of the cover layer arrangement.

4. The method of claim 1, wherein the cover layer arrangement comprises an oxide material and/or a nitride material, and a target layer thickness ranging from 100 to 2000 nm.

5. The method of claim 1, further comprising:
   applying a further cover layer arrangement on the cover layer arrangement; and
   structuring the further cover layer arrangement, so that the further cover layer arrangement comprises a recess.

6. The method of claim 5, wherein, in the step of heating, the emitted radiation passes through the recess to reach the magnetoresistive structure.

7. The method of claim 5, wherein the further cover layer arrangement comprises a photosensitive polyimide material with a target layer thickness ranging from 1 to 10 µm.

8. The method of claim 1, wherein the light source comprises an Nd:YAG laser, a semiconductor laser, a solid-state laser, a gas laser, or an LED element.

9. The method of claim 1, wherein the radiation emitted from the light source is monochromatic.

10. The method of claim 1, wherein the radiation emitted from the light source comprises a give wavelength λ ranging from 100 to 2000 nm.

11. The method of claim 1, wherein a metal sheet of the metal-insulator arrangement prevents irradiation onto the substrate material of at least part of the radiation emitted from the light source.

12. The method of claim 1, wherein the metal sheet is effective as a lightproof shield.

13. The method of claim 1, wherein the metal-insulator arrangement comprises a plurality of metal sheets, with each metal sheet comprising an insulation area at least partially surrounding same.

14. The method of claim 13, wherein one or a combination of a plurality of the metal sheets of the metal-insulator arrangement prevents irradiation onto the substrate material of at least part of the radiation emitted form the light source.

15. The method of claim 1, wherein the magnetoresistive structure comprises a BMR (giant magneto resistance) structure, a TMR (tunnel magneto resistance) structure, a spin valve structure, an AMR (anisotropic magneto resistance) structure, or an EMR (extraordinary magneto resistance) structure.

16. The method of claim 1, wherein the insulation area of the metal-insulator arrangement comprises an oxide material and/or a nitride material.

17. The method of claim 1, wherein the metal sheet comprises a material out of the following group of materials, the group including gold, aluminum, silver, copper, titanium, tungsten, and tin.

18. The method of claim 1, wherein the substrate material comprises a semiconductor material with an active or passive semiconductor circuit arrangement.

19. The method of claim 1, wherein the composite arrangement is exposed to an external magnetic field during the step of heating and ensuing cooling, to condition the magnetoresistive structure.

20. The method of claim 1, wherein the method of manufacturing a magnetoresistive device is performed on wafer level with a plurality of magnetoresistive devices.

21. The method of claim 1, wherein the magnetoresistive structure extends over the main surface of the substrate in a lateral direction, and wherein the magnetic field in the desired direction is provided along the lateral direction.

* * * * *